June 14, 1960 J. B. MERRILL 2,941,153

TRANSISTOR GAIN CONTROL

Filed Dec. 18, 1956 2 Sheets-Sheet 1

INVENTOR.
JOHN B. MERRILL

BY

T. L. Styner

ATTORNEY

June 14, 1960 J. B. MERRILL 2,941,153

TRANSISTOR GAIN CONTROL

Filed Dec. 18, 1956 2 Sheets-Sheet 2

INVENTOR.
JOHN B. MERRILL
BY
T. L. Styner
ATTORNEY

United States Patent Office 2,941,153

Patented June 14, 1960

2,941,153

TRANSISTOR GAIN CONTROL

John B. Merrill, Rochester, N.Y., assignor to General Dynamics Corporation, Rochester, N.Y., a corporation of Delaware Filed Dec. 18, 1956, Ser. No. 629,179

2 Claims. (Cl. 330—23)

This invention relates to transistors and is particularly directed to means for stabilizing the temperature and gain of the transistor.

It has been found that the resistance between electrodes and the amplification factor, or gain, of transistors of commercially available types varies widely with changes in temperature. For example, the variation of the common emitter current gain of typical silicon transistors is greater than 2 to 1 over a temperature range of −55° C. to 85° C. In transistor circuits where gain is important, design is severely compromised. Heretofore, chassis containing transistors have been provided with a source of thermostatically controlled heat. Inasmuch as the temperature sensitive portion of the transistor is only in the base immediately adjacent the interface between the emitter or collector and the base, such a temperature stabilizing system is needlessly wasteful of power.

The object of this invention is to provide improved means for controlling the operating temperature of transistors.

Another and more specific object of this invention is to provide means for localizing the heat, supplied from an external power source, in the operating regions of the transistor, thus reducing to a minimum the required heating power.

The objects of this invention are attained by extending the base of the *a* transistor beyond the region where the junctions of the collector, emitter, and other operative electrodes are placed, and then making electrical contact with the extended portion of the base and passing sufficient current through the base to heat the base. The heating current may be controlled in response to ambient temperature or in response to characteristics of the signal currents of the transistor.

Figure 1:
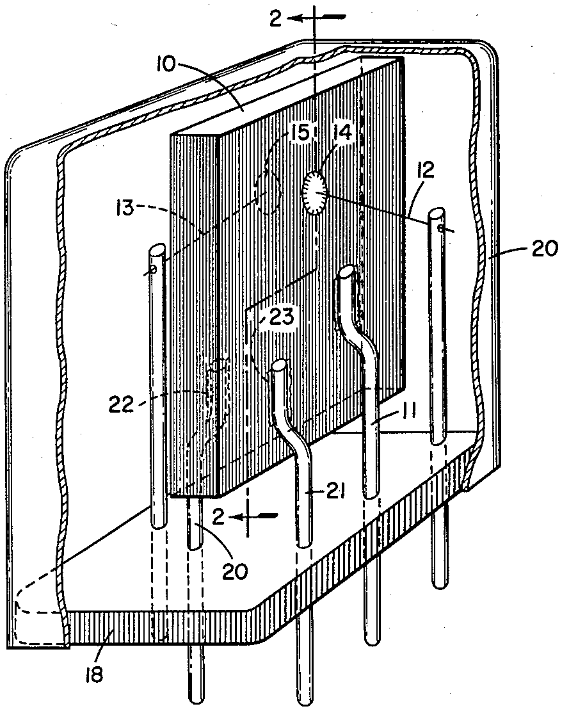
Figure 2:
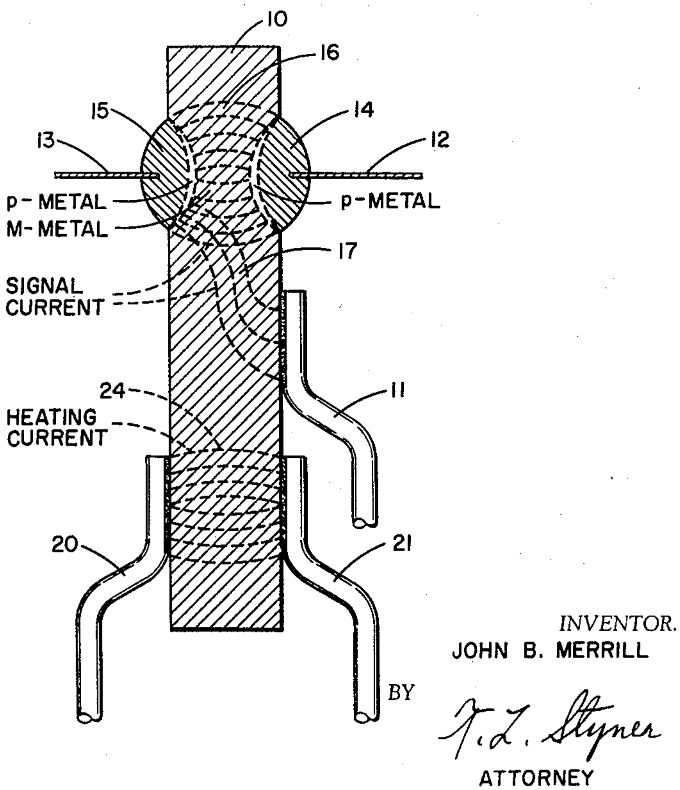
Figure 3:
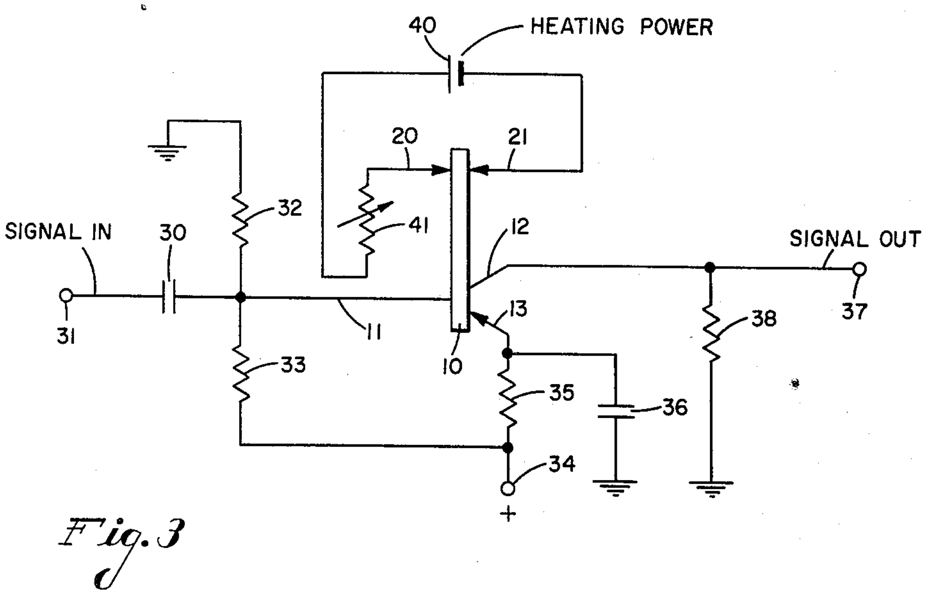
Figure 4:
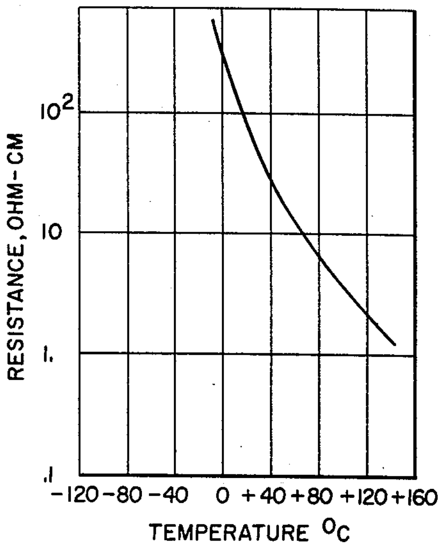

Other objects and features of this invention will become apparent by referring to a specific embodiment thereof described in the following specification and shown in the accompanying drawing in which Fig. 1 is a partly sectioned perspective view of one transistor embodying this invention, Fig. 2 is a sectional view of a transistor of the type shown in Fig. 1, Fig. 3 is a diagram of one circuit embodying the transistor of Fig. 1 and Fig. 4 is a graph showing the functional relation of temperature and resistance of a typical semi-conductor.

The particular transistor chosen for illustrating this invention comprises as shown in Fig. 1 the base 10, which preferably is a slab or wafer of semi-conducting material, such as germanium or silicon. The base may be cut from a polycrystalline or monocrystalline ingot of such semi-conducting material. The base material is doped with a minute quantity of impurities to make the material conductive of both electrons and holes in the manner widely accepted as being the normal functioning of transistors. Circuit connection is made to the base through lead wire 11 which at one end is soldered or otherwise electrically and mechanically connected to the base wafer.

Where a three electrode transistor is to be constructed, the collector electrode 12 and emitter electrode 13 are brought into contact with the base at points spaced from the base connector 11. The so-called "junction" type transistor is shown in Fig. 1 and the collector and emitter electrodes, comprising metal wires, are imbedded in buttons of a dissimilar material such as indium which will alloy with the base crystal. These buttons 14 and 15, better shown in Fig. 2, are formed by heating the assembled parts at a high temperature and for sufficient time to permit the alloying material (indium) to dissolve the germanium slightly. After an appropriate time interval the structure is cooled to allow the germanium to recrystallize out from the indium solution. When the base germanium is of the n-type, the recrystallized germanium with its indium contact forms a p-region on each side of the n-type germanium. Hence a transistor of the p-n-p type is formed. Usually the emitter is made the smaller of the two to insure a high degree of collection at the collector of those carriers leaving the emitter.

As shown in Fig. 2, electric fields established by voltage sources connected to the leads 11, 12 and 13, may be represented by dotted lines 16 between the collector and emitter and by dotted lines 17 between the emitter and base. Hence the operative regions of the transistor are essentially confined to regions 16 and 17 inasmuch as the carriers, including electrons and holes, will have mean velocities only in substantial coincidence with the electric lines 16 and 17. Except for mechanical reasons, all portions of the material of the base could be removed outside the operative regions 16 and 17 without affecting the operation of the transistor.

In Fig. 1, the three mentioned transistor leads are conveniently insulatingly supported in the stem 18. The envelope 19 carried on the stem mechanically protects the transistor, and if hermetically sealed and exhausted will tend to thermally insulate the transistor. That is, heat may be transmitted to or from the base 10 only by conduction through its leads, heat by connection or radiation being substantially eliminated.

According to an important and characteristic feature of this invention, means is provided for heating the base wafer 10. It has been found that the transistor parameters are largely dependent upon the temperature of the junctions of the electrodes with the base. In Fig. 4, for example, is shown the relationship of temperature in degrees centigrade to the resistance in ohm-centimeters of n-type germanium. The resistance drops from over 100 ohm-centimeters at 0° C. to 10 ohm-centimeters at room temperature. Such a wide variation of germanium resistance seriously compromises circuit designs using transistors of this material. In Fig. 1 the base 10 is directly heated by passing current of heating magnitude through the base material. Power terminals 20 and 21 are soldered or otherwise electrically connected to spaced points on the base 10, as for example on opposite sides of the wafer. The placement of the soldered connections and the distance between those connections is chosen with reference to the specific resistance of the material between the soldered connections, the voltage of the heating current source, and the amount of current and heat required to be dissipated in the transistor for heating the base to the optimum operating temperature. At the same time the placement of the soldered connections 22 and 23 with respect to the signal currents in the operating region 16 and 17 of the transistor is so chosen as to assure decoupling between the signal current and the heating current. That is, the heating current region 24, Fig. 2, is sufficiently removed from the signal current region 16 and 17 as to negligibly affect the signal current by variations of the heating current. This can easily be done even though carriers from the signal region may diffuse and permeate the entire base volume. In transistors of the type commonly used for amplification of radio signals, the total heat generated in region 24 may be of the order of 50 milliwatts.

A typical application of the transistor of this invention as an amplifier is shown in Fig. 3. The base connection 11 is coupled through condenser 30 to a signal source 31, usually of minute current and/or voltage, and a suitable static bias is imposed upon the base by means of a potentiometer comprising resistances 32 and 33 connected across the bias source 34. The emitter 13 is connected through the load resistor 35 to the bias source, which is usually by-passed by the condenser 36. The output of the transistor in this circuit comprises the collector 12 connected to the output signal circuit 37 across the load resistor 38. Obviously, if the specific resistance of the base 10 changes with temperature, the amplification of such amplifier will change. To raise and hold the temperature of the base and its electrode junctions to an optimum operating temperature, heating terminals 20 and 21 are connected to the heating source 40. Preferably, the amount of heating current is controlled by a heat sensitive device 41, with an appropriate temperature coefficient of resistance, in the heating circuit and in good heat transfer relation with the base 10. The $I^2R$ heat generated between the terminals 20—21 is transmitted by conduction to the junctions 12 and 13. This heat conduction, however, is not accompanied by disturbing electric fields to modify the normal amplifying action of the transistor.

By varying the temperature of the base, the gain of the amplifier can be varied. Resistance of 41 could be varied automatically or manually for this purpose.

While a junction-type transistor has been shown, this invention including the heating means could be applied to the contact type transistor or to any transistor in which base resistance is a function of temperature. Further, this invention may be applied to diodes or to tetrodes in which semi-conducting materials are employed.

Many modifications may be made in this invention without departing from the scope of the appended claims. Accordingly, the specific examples mentioned above are to be taken as illustrative only and not as limitive of this invention.

What is claimed is:

1. In combination, a semi-conducting device comprising a base, and at least one cooperative electrode attached thereto, a terminal connected to said base, said base being a body of semi-conducting material and adapted for electron-current conduction in the region situated approximately between the junctions of said attached electrode and said terminal; and means for selectively heating the base body comprising two spaced power terminals contacting said body at points displaced from said electron region, and a source of power connected to said power terminals, and means connected in circuit between said source of power and said power terminals for adjusting the temperature of said base to a predetermined temperature above the normal ambient operating temperature of said base.

2. In combination, a body of semi-conducting material, the specific resistance of which is a function of temperature, a signal source, electrodes connecting said signal source to said semi-conducting body; and means for stabilizing the temperature and resistance characteristics of said body comprising additional electrodes contacting said body at spaced points for passing said heating current through said body, a source of heating power, said source of heating power being connected to said additional electrodes, a heat sensitive device with an appropriate temperature coefficient of resistance in good heat transfer relation with said body, said heat sensitive device being connected in circuit between said source of heating power and said additional electrodes for maintaining said body at an optimum temperature.

References Cited in the file of this patent

UNITED STATES PATENTS

| | | |
|---|---|---|
| 1,751,362 | Ruben | Mar. 18, 1930 |
| 2,666,814 | Shockley | Jan. 19, 1954 |
| 2,820,855 | Sherr | Jan. 21, 1958 |

UNITED STATES PATENT OFFICE

CERTIFICATE OF CORRECTION

Patent No. 2,941,153 June 14, 1960

John B. Merrill

It is hereby certified that error appears in the printed specification of the above numbered patent requiring correction and that the said Letters Patent should read as corrected below.

Column 2, line 41, for "connection" read -- convection --.

Signed and sealed this 13th day of December 1960.

(SEAL)
Attest:

KARL H. AXLINE
Attesting Officer

ROBERT C. WATSON
Commissioner of Patents